United States Patent
Zhou et al.

(10) Patent No.: US 9,508,744 B2
(45) Date of Patent: Nov. 29, 2016

(54) TFT-DRIVEN DISPLAY DEVICE

(71) Applicants: Shanghai Tianma Micro-Electronics Co., Ltd., Shanghai (CN); Tianma Micro-Electronics Co., Ltd., Shenzhen (CN)

(72) Inventors: Xingyao Zhou, Shanghai (CN); Qijun Yao, Shanghai (CN); Jun Ma, Shanghai (CN); Wei Wang, Shanghai (CN)

(73) Assignees: SHANGHAI TIANMA MICRO-ELECTRONICS CO., LTD., Shanghai (CN); TIANMA MICRO-ELECTRONICS CO., LTD., Shenzhen (CN)

( * ) Notice: Subject to any disclaimer, the term of this patent is extended or adjusted under 35 U.S.C. 154(b) by 0 days.

(21) Appl. No.: 14/083,350

(22) Filed: Nov. 18, 2013

(65) Prior Publication Data
US 2014/0374763 A1 Dec. 25, 2014

(30) Foreign Application Priority Data

Jun. 24, 2013 (CN) .......................... 2013 1 0254828

(51) Int. Cl.
*H01L 27/14* (2006.01)
*H01L 29/04* (2006.01)
(Continued)

(52) U.S. Cl.
CPC ......... *H01L 27/1222* (2013.01); *G06F 3/0412* (2013.01); *H01L 27/323* (2013.01); *G02F 1/13338* (2013.01); *G02F 1/133512* (2013.01)

(58) Field of Classification Search
CPC ............... H01L 27/1214; H01L 27/12; H01L 29/66751; H01L 27/3211; H01L 27/3244; H01L 29/66765; H01L 29/4908; G02F 1/13454; G02F 1/136227

USPC ............... 31/498–512; 257/72, 59, E51.022, 257/E25.032; 438/149, FOR. 201, 438/FOR. 184, FOR. 157, FOR. 287
See application file for complete search history.

(56) References Cited

U.S. PATENT DOCUMENTS 5,563,432 A * 10/1996 Miura .................. G02F 1/1368
257/291
5,739,886 A * 4/1998 Shibahara ..................... 349/139
(Continued)

FOREIGN PATENT DOCUMENTS

JP 2006235612 A 9/2006
WO 2012001740 A1 5/2012
(Continued)

OTHER PUBLICATIONS

Partial European Search Report for European Patent Application No. 13198084.9, mailed Nov. 25, 2014, 6 pages total.
(Continued)

*Primary Examiner* — Thao X Le
*Assistant Examiner* — Nduka Ojeh
(74) *Attorney, Agent, or Firm* — Alston & Bird LLP

(57) ABSTRACT

A TFT-driven display device includes an upper substrate and a lower substrate facing each other, multiple TFTs disposed on a side of the lower substrate facing the upper substrate, and a metal layer disposed on a side of the upper substrate facing the lower substrate. The metal layer includes multiple horizontal metal wirings extending in a direction of scanning lines and including portions overlapping with an active layer of the TFTs in the light transmission direction, the overlapping portions have a pattern width less than that of other portions that do not overlap with the active layer. A photo-leakage current caused by light reflected by the metal layer may be reduced, because no portion of the metal layer is provided in the position opposed to the active layer of the TFTs located on a TFT array substrate.

15 Claims, 11 Drawing Sheets

(51) Int. Cl.
*H01L 29/15* (2006.01)
*H01L 31/036* (2006.01)
*H01L 27/12* (2006.01)
*G06F 3/041* (2006.01)
*H01L 27/32* (2006.01)
*G02F 1/1333* (2006.01)
*G02F 1/1335* (2006.01)

(56) References Cited

U.S. PATENT DOCUMENTS

| | | | |
|---|---|---|---|
| 2006/0255726 A1* | 11/2006 | Kim | 313/506 |
| 2008/0278070 A1 | 11/2008 | Kim | |
| 2010/0110351 A1* | 5/2010 | Kim et al. | 349/114 |
| 2011/0267297 A1 | 11/2011 | Yamazaki et al. | |
| 2013/0044074 A1 | 2/2013 | Park et al. | |
| 2014/0198268 A1* | 7/2014 | Sugita | G06F 3/044 349/12 |

FOREIGN PATENT DOCUMENTS

| | | |
|---|---|---|
| WO | 2012063787 A1 | 5/2012 |
| WO | 2012063788 A1 | 5/2012 |
| WO | WO 2012063787 A1 * | 5/2012 |

OTHER PUBLICATIONS

European Search Report for European Application No. 13198084.9, mailed on Mar. 19, 2015, 11 pages total.

* cited by examiner

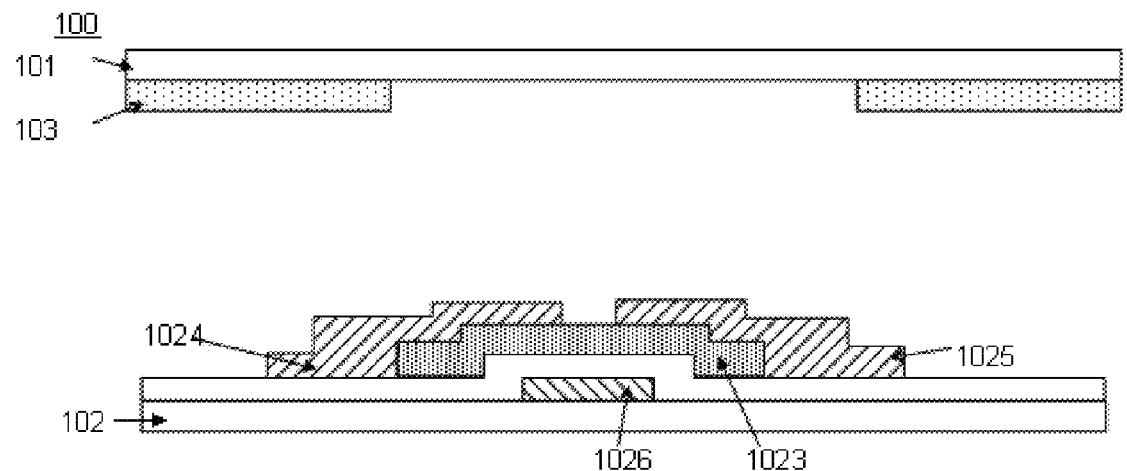
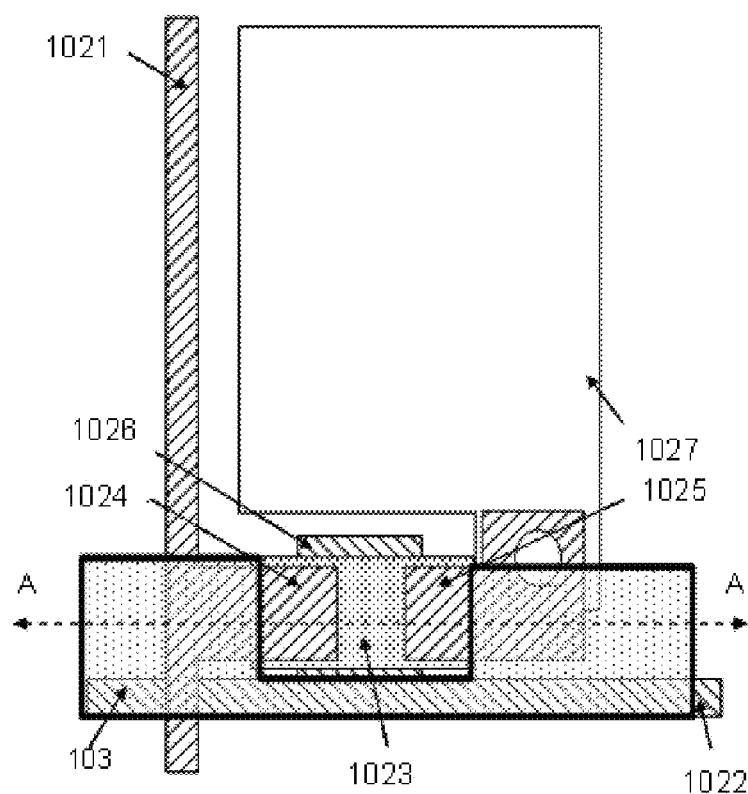
FIG. 1
FIG. 2

TFT-DRIVEN DISPLAY DEVICE

CROSS REFERENCE TO RELATED APPLICATION

This application claims the benefit of priority to Chinese Patent Application No. 201310254828.5, entitled "TFT-DRIVEN DISPLAY DEVICE", filed with the Chinese Patent Office on Jun. 24, 2013, the contents of which is incorporated herein by reference in its entirety.

FIELD OF THE INVENTION

The present disclosure relates to the field of semiconductor, and more particularly to a TFT-driven display device.

BACKGROUND OF THE INVENTION

A conventional technique includes driving a display device with a Thin Film Transistor (TFT). For example, a Thin Film Transistor Liquid Crystal Display (TFT-LCD) generally includes a color filter substrate and a TFT array substrate. The TFT array substrate includes multiple pixel units, and each pixel unit is associated with one TFT. When a certain voltage is applied to the gate of the TFT, the channel is switched on, and an electric current flows from the source to the drain of the TFT. A certain voltage difference between a pixel electrode and a common electrode causes liquid crystal molecules to rotate by different angles, so as to create light and dark display in different areas.

However, the TFT is a photosensitive element. If a metal layer is provided on a side of the color filter substrate facing the TFT array substrate, e.g., a metal layer needs to be provided commonly when a touch-control structure is built in, the metal layer will reflect the light from a backlight toward the TFT array substrate. A leakage current, i.e., a photo leakage current, will occur when the light irradiates the channel. In this case, a voltage of the pixel electrode becomes different from a predetermined voltage, thereby resulting in an uneven display.

BRIEF SUMMARY OF THE INVENTION

A TFT-driven display device is provided in the present disclosure. The TFT-driven display device includes: an upper substrate; a lower substrate, the lower substrate being a TFT array substrate; and a metal layer disposed on a side of the upper substrate facing the lower substrate, wherein a portion of the metal layer does not overlap with an active layer of TFTs in the TFT array substrate in a light transmission direction, or a portion of the metal layer overlapping with the active layer has a pattern width less than a pattern width of other portions of the metal layer that do not overlap with the active layer.

A preferred technical solution is further provided in the present disclosure. A metal layer A provided at a position opposed to an active layer includes two portions, i.e., a first portion A1 and a second portion A1. The first portion A1 overlaps at least partially with the active layer in a light transmission direction in a region Z1 which has a distance X from an edge of the active layer and extends toward the inside of the active layer. Specifically, the distance X is greater than or equal to a distance Y from the active layer to the metal layer. The second portion A1 connects the first portion A1 to other portions of the metal layer.

Another preferred technical solution is further provided in the present disclosure. A metal layer overlaps at least partially with an active layer in a light transmission direction in a region Z1 which has a distance X from an edge of the active layer and extends toward the outside of the active layer. Specifically, the distance X is greater than or equal to the distance Y from the active layer to the metal layer.

The technical solution provided in the present disclosure may be applied to a liquid crystal display device or other display devices. Particularly, the technical solution provided in the present disclosure may be applied to a liquid crystal display device with a built-in touch-control structure.

BRIEF DESCRIPTION OF THE DRAWINGS

FIG. 1 is a sectional view taken along the AA line in FIG. 2;

FIG. 2 is a schematic diagram showing a first embodiment of the present disclosure;

DETAILED DESCRIPTION OF THE INVENTION

First Embodiment

Figure 3:
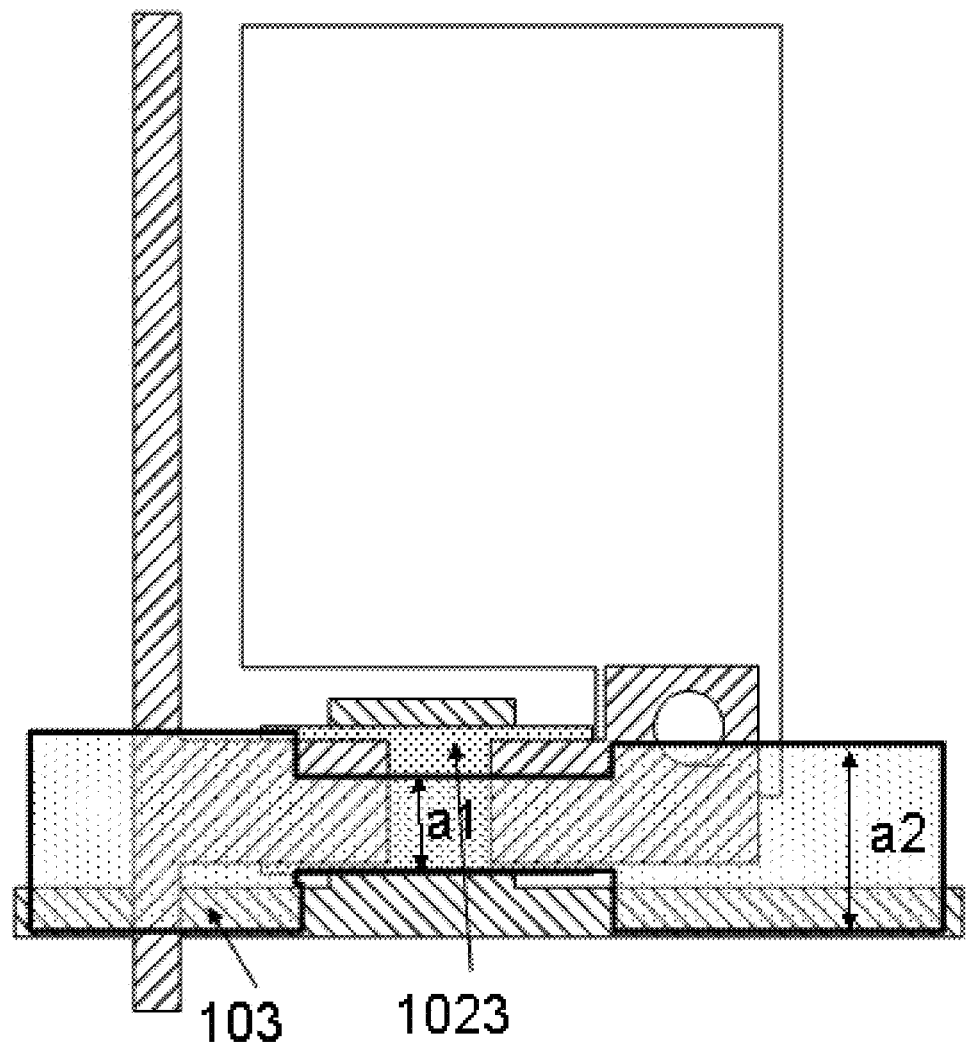
FIG. 3 shows another implementation according to the first embodiment.

FIG. 1 and FIG. 2 are schematic diagrams of a first embodiment of the present disclosure. FIG. 1 is a sectional view taken FIG. 2 along the AA line, and FIG. 2 is a top view.

A TFT-driven display device 100 is provided. The TFT-driven display device 100 includes an upper substrate 101 and a lower substrate 102. A metal layer 103 is provided on a side of the upper substrate 101 facing the lower substrate 102, which is adapted to wire an upper common electrode.

The lower substrate 102 is a TFT array substrate, which includes pixel units defined by data lines 1021 and scanning lines 1022. Each of the pixel units includes a TFT and a pixel electrode 1027. Specifically, the source 1024 of the TFT is connected to one of the data lines 1021, the gate 1026 of the TFT is connected to one of the scanning lines 1022, and the drain 1025 of the TFT is connected to the pixel electrode 1027. The TFT further includes an active layer 1023 disposed on the side of the lower substrate 102 facing the upper substrate 101. The metal layer 103 does not overlap with the active layer 1023 of the TFT in a light transmission direction.

In the TFT-driven display device, a metal layer, such as a touch-control structure including a metal layer, or an electrode wiring of the upper common electrode, may be provided on the side of the upper substrate facing the lower substrate sometimes. The wiring of the upper common electrode is taken as an example in this embodiment.

Generally, in a Twisted Nematic (TN) liquid crystal display in the prior art, a transparent common electrode may be provided on the whole side of the upper substrate facing the lower substrate. However, the common electrode has a large resistance, because the common electrode is formed of metal oxide. In order to reduce the resistance, some wirings of the common electrode formed of metal may be provided on the side of the upper substrate facing the lower substrate at a position opposed to the data line or the scanning line. The metal layer can reflect light, such as the light from a backlight of the display device, or the light which is obtained by reflecting external light irradiating from one side of the upper substrate on a metal layer of the TFT array substrate (such as the source, the drain and the metal wiring) and then irradiating the reflected light onto the metal layer. If the light reflected on the metal layer irradiates the active layer of the TFT, the photo leakage current of the TFT will occur.

In the first embodiment, the metal layer 103 does not overlap with the active layer 1023 of the TFT in the light transmission direction, that is, no metal layer 103 is provided on the side of the upper substrate 101 facing the lower substrate 102 at a position opposed to the active layer 1023 in the TFT array substrate. Thus this position does not function to reflect the light. Therefore, the photo leakage current of the TFT will be reduced, and the performance of the display device 100, such as display homogeneity, will be improved.

Next, reference may be made to FIG. 3, which shows another implementation according to the first embodiment. The difference between the structure shown in FIG. 3 and the structure shown in FIG. 1 and FIG. 2 is that in the TFT-driven display device according to the another implementation, portions of the metal layer 103 that overlap with the active layer 1023 of the TFT in the light transmission direction have a pattern width a2 less than a pattern width a2 of other portions that do not overlap with the active layer.

In a design of the device, sometimes, if no metal layer 103 needs to be provided at a position overlapping with the active layer 1023 of the TFT in light transmission direction, no metal layer 103 may be provided in this position. If a metal layer 103 must be provided at the position overlapping with the active layer 1023 of the TFT in light transmission direction to function as an electrical connection or a physical connection, the metal layer 103 provided in this position has a pattern width a1 less than a pattern width a2 of other portions. Preferably, the pattern width a1 is set to be a minimum value for a process capability, as long as the metal layer 103 provided in this position functions as a connection.

Generally, in an existing etching process, the minimum value for the process capability is 5 µm or less.

Optionally, the TFT-driven display device may be a liquid crystal display device, an OLED display device or the like. In the case of the liquid crystal display device, the metal layer generally reflects light from a backlight. In the case of the OLED display device, the metal layer generally reflects light from a light emitting layer.

Second Embodiment

Figure 4:
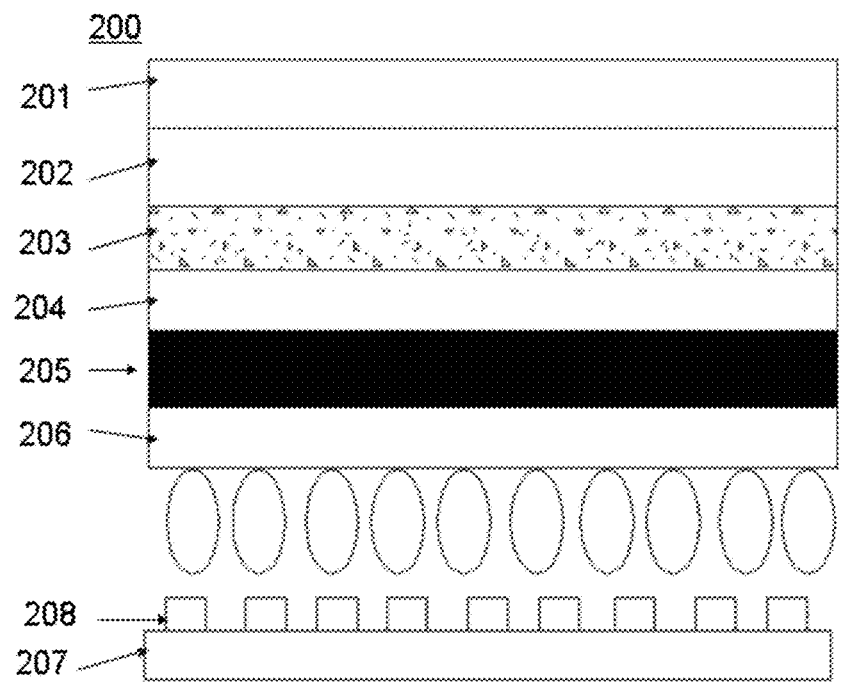
FIG. 4 is a schematic diagram of a liquid crystal display device with a built-in touch-control structure according to a second embodiment.

FIG. 4 is a schematic diagram showing a second embodiment of the present disclosure, in which the content of the present disclosure is described by taking a liquid crystal display device 200 as an example. In the second embodiment, the liquid crystal display device 200 with a built-in touch-control structure includes a color filter substrate and a TFT array substrate provided oppositely, and a liquid crystal layer provided between the color filter substrate and the TFT array substrate.

The color filter substrate includes a first substrate 201, a black matrix 202 provided below the first substrate 201, a first conductive layer 203, a color filter layer 204, a second conductive layer 205 and a flat layer 206 in this order. The TFT array substrate includes a second substrate 207, a TFT array 208 provided above the second substrate 207, and the like in this order.

Figure 5:
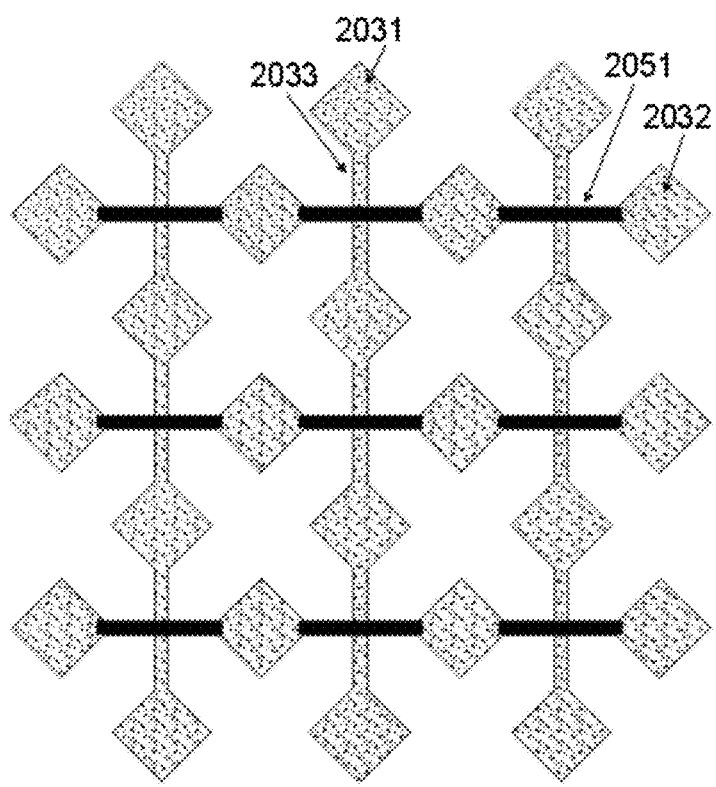
FIG. 5 is a schematic diagram of the touch-control structure according to the second embodiment.

The first conductive layer 203, the color filter layer 204 and the second conductive layer 205 further constitute a touch-control layer structure. Specifically, referring to FIG. 5, the first conductive layer 203 includes multiple first touch-control electrodes 2031, multiple second touch-control electrodes 2032, and multiple first bridges 2033 by which two adjacent first touch-control electrodes 2031 are connected to form a driving line.

The first conductive layer 203 is covered by the color filter layer 204 provided below the first conductive layer 203. Multiple via holes are provided in the color filter layer 204.

The second conductive layer 205 is a metal layer. The second conductive layer 205 includes multiple second bridges 2051 by which two adjacent second touch-control electrodes 2032 are connected through the via hole in the color filter layer 204 to form a sensing line. Specifically, overlapping portions of the second bridge 2051 with an active layer of the TFT array in the light transmission direction have a pattern width less than other portions.

Figure 6:
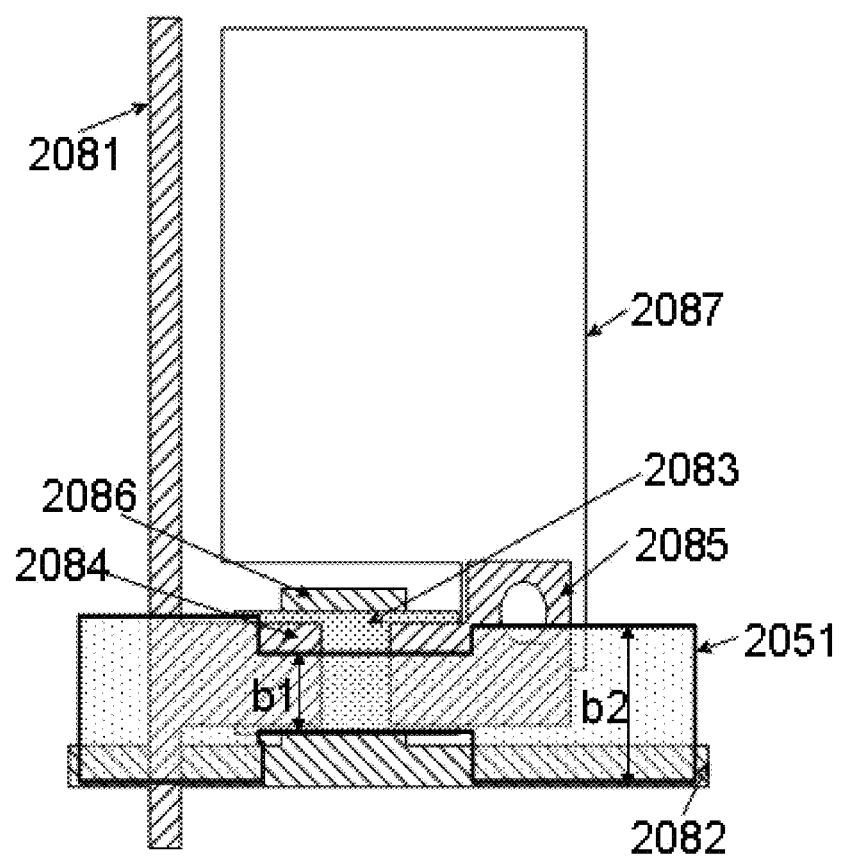
FIG. 6 is a schematic diagram of an implementation of a second bridge according to the second embodiment.

Specifically, referring FIG. 6, each TFT includes the gate 2086, the active layer 2083, the source 2084 and the drain 2085. The gate 2086 is connected to a scanning line 2082, the active layer 2083 is provided above the gate 2086, the source 2084 is connected to a data line 2081, and the drain 2085 is connected to a pixel electrode 2087. A pattern width b 1of overlapping portions of the second bridge 2051 with the active layer 2083 of the TFT in the light transmission direction is less than a pattern width b 2 of other portions.

When the liquid crystal display device is operated, light from a backlight of the liquid crystal display device passes through the pixel electrode 2087 and the liquid crystal layer to irradiate the second bridge 2051. The second bridge 2051 may reflect the light from the backlight, because the second bridge 2051 is formed of a metal material. If the light is reflected to the active layer 2083 of the TFT, a photo leakage current of the TFT may occur. Specifically, although a part of the active layer 2083 is sheltered by the source 2084 and the drain 2085, other parts of the active layer 2083, such as a channel portion, will still be exposed. Generally, a voltage difference may be present between the source 2084 and the drain 2085, even if the channel is switched off. The leakage current, i.e., the so called photo leakage current, will occur, when the active layer 2083 is irradiated by light. A predetermined voltage of the pixel cannot be maintained due to the photo leakage current, thereby resulting in an uneven display.

In the second embodiment, overlapping portions of the second bridge 2051 with the active layer 2083 in the light transmission direction have a smaller pattern width, thus the area of the region for reflecting light will become smaller, and the reflected light and the photo leakage current may be further reduced. Therefore, the display homogeneity of the liquid crystal display device with a built-in touch-control layer will be improved.

Preferably, the smaller the pattern width b1 of the overlapping portions of the second bridge 2051 with the active layer 2083 in the light transmission direction, that is, the smaller the area of region for reflecting light, the better the effect on the reduction of the photo leakage current. Preferably, the value of the pattern width b1 is a minimum value for an etching process, which is 5 µm or less.

In other implementations, the second bridge may not be provided in a position overlapping with the active layer in the light transmission direction. Instead, the second bridge is provided in a position overlapping with the scanning line in the light transmission direction, which can also function to reduce the light reflection effect.

Optionally, in the touch-control structure, an insulating layer between the first conductive layer 203 and the second conductive layer 205 may be provided, rather than the color filter layer of the display device.

Optionally, the TFT-driven display device may be a liquid crystal display device, an OLED display device or the like. In the case of the OLED display device, the second bridge mainly reflects light from a light emitting layer of the OLED.

Optionally, the first touch-control electrode 2031 is a sensing electrode, and the second touch-control electrode 2032 is a driving electrode, which may be interchanged in other implementations.

Optionally, the second touch-control electrodes 2032 may also be located in the second conductive layer 205, and are connected by the second bridge 2051 located in the second conductive layer 205 to form a sensing line.

Optionally, the first conductive layer 203 may be formed of metal or metal oxide, such as indium tin oxide. When the first conductive layer 203 is a metal layer, although the first conductive layer 203 has weaker light reflection effect than the second conductive layer 205 because the first conductive layer 203 is sheltered by the color filter layer 204, some photo leakage current caused by the reflected light from the second conductive layer 205 may still exist. Therefore, in a preferred implementation, overlapping portions of the first bridge 2033 with the active layer 2083 in the light transmission direction have a pattern width less than other portions, or the first bridge 2033 does not overlap with the active layer 2083 in the light transmission direction. Thus, the photo leakage current is further reduced, and the display homogeneity is improved.

Optionally, the first touch-control electrode 2031 and the second touch-control electrode 2032 are a metal hollow electrode. The hollow portion is opposed to each color resist of the color filter layer 204. The electric resistivity and the power consumption can be reduced by using the metal electrode. The hollow portion is opposed to each color resist of the color filter layer 204, that is, the electrode has a visible part overlapping with the black matrix, and thereby the electrode has higher transmittance than an ITO electrode.

Third Embodiment

Figure 7:
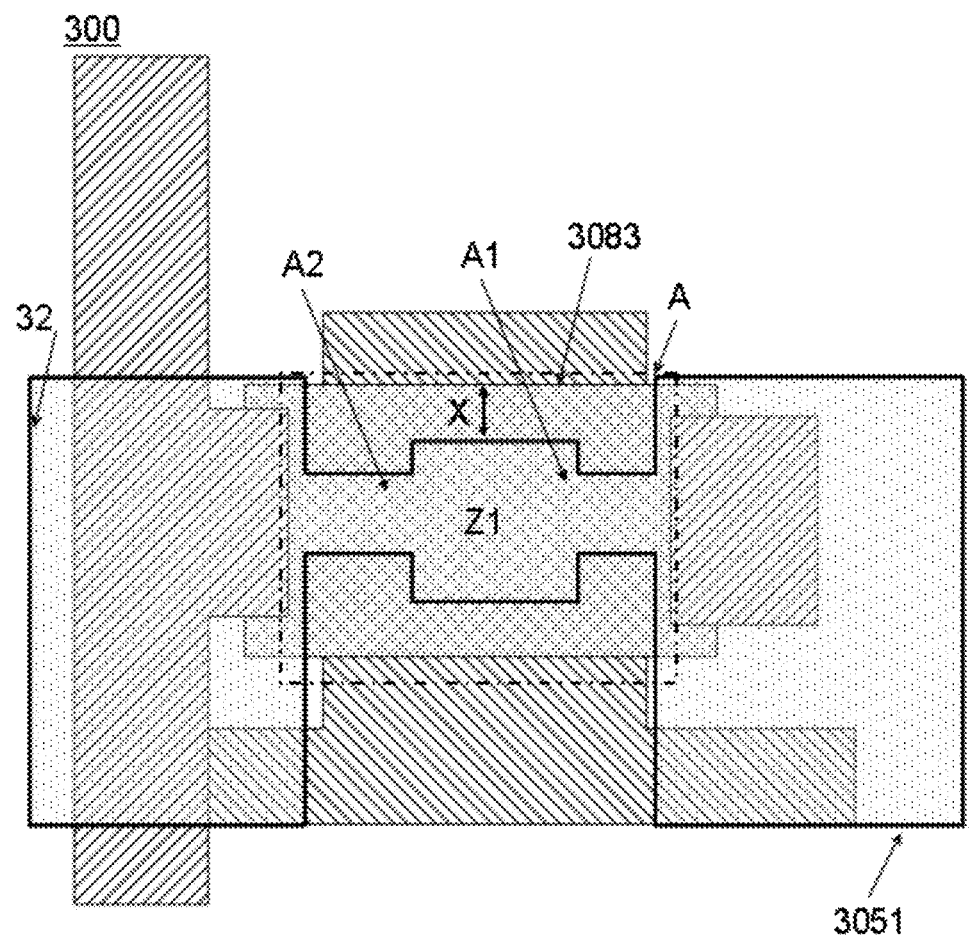
FIG. 7 is a schematic diagram of another implementation of a second bridge according to a third embodiment.

A liquid crystal display device 300 with a built-in touch-control structure is provided in this embodiment of the present disclosure. FIG. 7 is a schematic diagram showing a third embodiment. The same portion of the liquid crystal display device 300 according to the third embodiment as that according to the second embodiment will not be described in detail herein. The differences between the second and third embodiments include the followings. A portion of a second bridge 3051 opposed to an active layer 3083 is at least partially located in a first non-reflective region Z1. The first non-reflective region Z1 overlaps with the active layer 3083 in the light transmission direction. In addition, a distance from an edge of the first non-reflective region Z1 to an edge of the active layer 3083 in the light transmission direction is greater than or equal to a distance from the active layer 3083 to the second bridge 3051.

Figure 8:
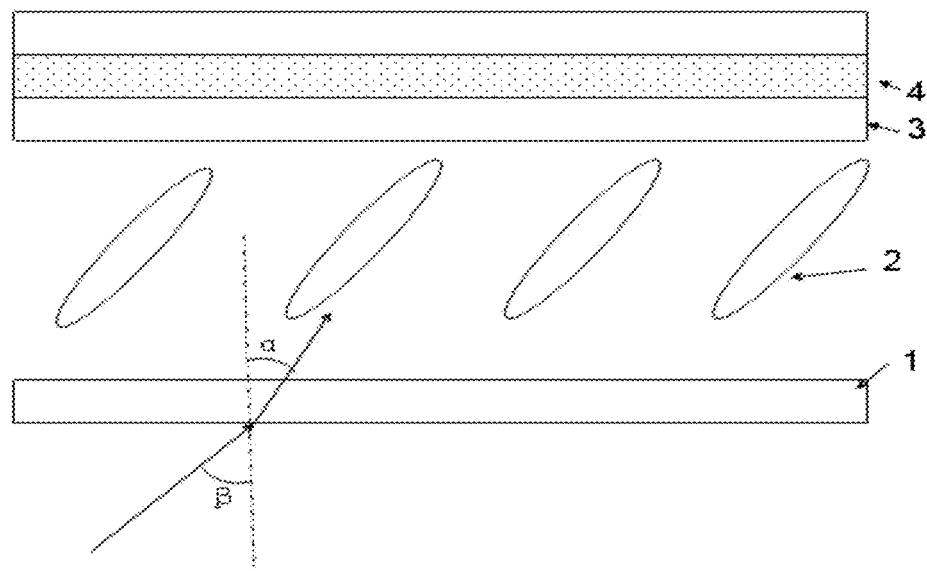
FIG. 8 is a schematic diagram of that backlight enters into a liquid crystal cell of a TFT-driven liquid crystal display device.
Figure 9:
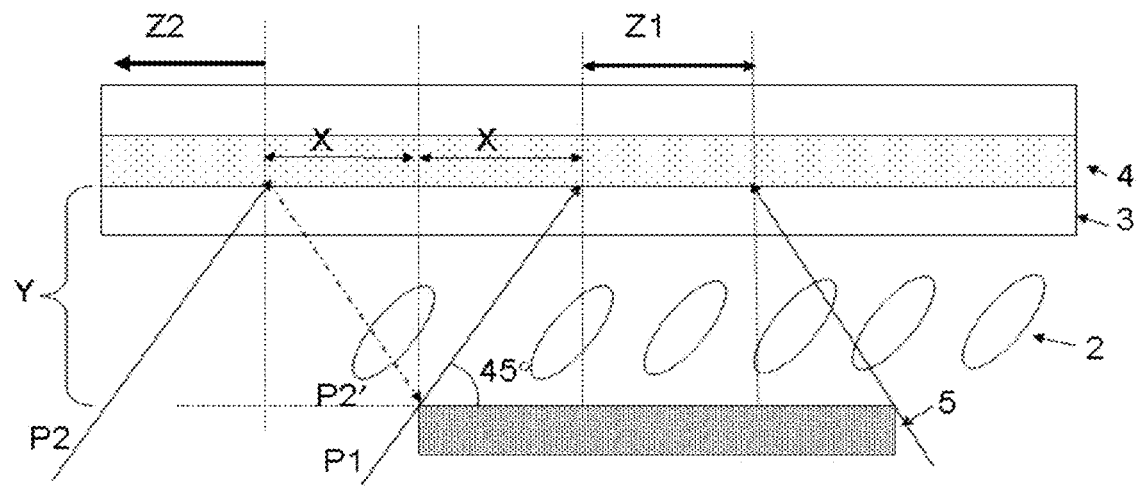
FIG. 9 is a schematic diagram showing that backlight irradiates a metal layer located on the inner side of an upper substrate of a TFT-driven liquid crystal display device.

The inventor discovered that the liquid display device has a region from which no light will be reflected to the active layer. A principle in which light enters into a liquid crystal cell and is reflected will be described in conjunction with the drawings below. Referring to FIG. 8 and FIG. 9, FIG. 8 is a schematic diagram showing that backlight enters into a liquid crystal cell of a TFT-driven liquid crystal display device, and FIG. 9 is a schematic diagram showing that backlight irradiates a metal layer located on the inner side of an upper substrate of the TFT-driven liquid crystal display device.

Before irradiating metal layer 4, the backlight must firstly pass through a lower substrate 1, a liquid crystal layer 2 and a flat layer 3. The lower substrate 1 is generally a glass substrate. The refractive index nglass of glass is approximately 1.5, and the refractive index of air nair is 1. The backlight transmits from an optically thinner medium to an optically denser medium, thus an incident angle β is greater than a refraction angle α. According to the law of refraction:

$$\text{nair} \times \sin \beta = \text{nglass} \times \sin \alpha, \text{ and}$$

$$\sin \alpha = \text{nair} \times \sin \beta / \text{nglass},$$

where the maximum value of β, that is, incident angle, is 90 degree, then $$\sin \alpha \leq \text{nair}/\text{nglass} = 1/1.5, \text{ and}$$

$$\alpha \leq \arcsin(1/1.5) \approx 41.8°,$$

hence the refraction angle α of light is smaller than or equal to 41.8°, that is, the maximum value of the angle of the light after entering into the glass is 41.8°. When the light further passes through the liquid crystal layer 2 and the flat layer 3, and irradiates the metal layer 4, the angle of the light is approximately 45°. In order to facilitate the calculation, it is assumed that the maximum value of the angle of the backlight is 45° when the backlight irradiates the metal layer 4.

Next, referring to FIG. 9, the active layer 5 is located inside the liquid crystal cell. A vertical distance from the active layer 5 to the metal layer 4 is Y. The distance Y can be calculated from the sum of the thicknesses of multiple membranous layers, such as the liquid crystal layer 2 and the flat layer 3, between the active layer 5 and the metal layer 4.

When the backlight P 1 irradiates the metal layer 4 through the glass substrate, the maximum value of the incident angle of the backlight P1 is 45°. In this case, the portion of the metal layer 4 on which reflects the backlight overlaps with the active layer 5 in the light transmission direction, and has a distance X from an edge of the active layer 5 in the light transmission direction. The value of X is Y×tan 45°, that is, the distance X is equal to the distance Y from the active layer 5 to the metal layer 4. Because the incident angle cannot be greater than 45°, a portion that extends from the above portion toward the inside of the metal layer 4 can not be irradiated, and thus no light will be reflected from this portion to the active layer 5. That is, the metal layer 4 has a first non-reflective region Z1, which overlaps with a part of the active layer 5 in the light transmission direction. Further, a distance from an edge of the first non-reflective region Z1 to an edge of the active layer 5 in the light transmission direction is greater than or equal to a distance from the active layer 5 to the metal layer 4. Therefore, the photo leakage current caused by the reflected light will be reduced, as long as the metal layer 4 is partially provided in this region Z1.

Next, referring to FIG. 9, when the backlight P2 irradiates the metal layer 4 at the maximum incident angle of 45°, the reflection angle is equal to the incident angle according to the law of reflection. If the reflected light P2' needs to irradiate the active layer 5, the incident light P2 needs to irradiate at least the portion of the metal layer 4 which has a distance X from the edge of the active layer 5 in the light transmission direction. If the incident point moves further away from the active layer 5, the reflected light cannot irradiate the active layer 5. That is, the metal layer 4 has a second non-reflective region Z2 which does not overlap with the active layer 5 in the light transmission direction. In addition, a distance from an edge of the second non-reflective region Z2 to the edge of the active layer 5 in the light transmission direction is greater than or equal to a distance Y from the active layer 5 to the metal layer 4. The second non-reflective region Z2 is a region which cannot reflect the backlight. Therefore, the photo leakage current caused by the reflected light from the metal layer 4 will be reduced, as long as the metal layer 4 is partially provided in this region Z2.

Figure 10:
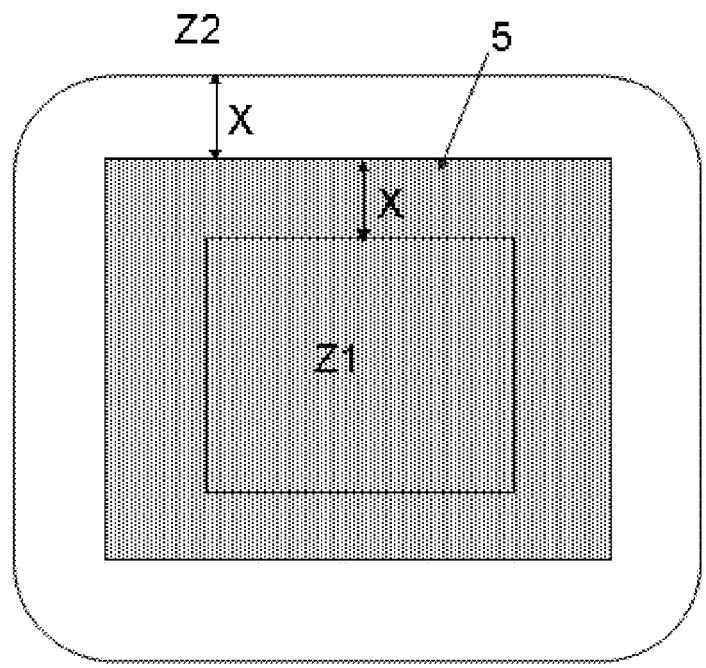
FIG. 10 is a schematic diagram showing a region which is not influenced by reflected light.

Referring to FIG. 10, in summary, the metal layer 4 has the first non-reflective region Z1 and the second non-reflective region Z2 from which no light will be reflected. The first non-reflective region Z1 overlaps with a part of the active layer 5 in the light transmission direction. The distance from the edge of the first non-reflective region Z1 to the edge of the active layer 5 in the light transmission direction is X. The second non-reflective region Z2 does not overlap with the active layer 5 in the light transmission direction. The distance from the edge of the second non-reflective region Z2 to the edge of the active layer 5 in the light transmission direction is X. Specifically, X is greater than or equal to the value of the vertical distance Y from the active layer 5 to the metal layer 4. Therefore, the photo leakage current caused by the reflected light will be reduced, as long as the metal layer 4 is provided in the region Z1 and the region Z2. Furthermore, if the metal layer is provided in a region between the first non-reflective region Z1 and the second non-reflective region Z2, the reflected light from the metal layer in this region will all be reflected to the active layer 5. In the design of the device, it is preferable that no metal layer is provided in the region between the first non-reflective region Z1 and the second non-reflective region Z2, for reducing the photo leakage current caused by the reflected light.

In summary, in the third embodiment, the part of the second bridge 3051 corresponding to the active layer 3085 includes two portions, i.e., a first portion A1 and a second portion A2, Specifically, the first portion A1 is located in the first non-reflective region Z1, and the second portion A2 connects the first portion A1 to the other portions of the second bridge 3051. Thus, the photo leakage current will be reduced, because no light will be reflected from the first portion A1 to the active layer 3085.

At the same time, no photo leakage current will occur due to the metal layer provided in the first non-reflective region Z1. Therefore, an area of the first portion A1 in the first non-reflective region Z1 can be set to be as large as possible, thus reducing the resistance of the second bridge and the power consumption of the touch-control layer.

The second portion A2 connects the first portion A1 to the other portions of the metal layer. It should be understood that light will be reflect from the second portion A2 to the active layer 3085 inevitably. However, the second portion A2 is necessary to connect the first portion A1 to other portions, so that the whole second bridge 3051 becomes an electrically connected integral. However, in order to reduce the reflection effect of the second portion A2, the pattern width of the second portion A2 is set to be the minimum value for a process capability, which is 5 μm or less.

In other implementations, if the pixel has a proper size, it is preferable that the second portion A2 is at least partially provided in the first non-reflective region Z1 or the second non-reflective region Z2 to reduce the photo leakage current.

Furthermore, the first conductive layer in the third embodiment is also a metal layer. The first conductive layer is sheltered by the color filter layer located below the first conductive layer, so that the first conductive layer has weaker light reflection effect than the second conductive layer. However, the light reflection effect will still exist. In order to reduce the reflection effect of the first conductive layer, in this embodiment, the first conductive layer does not overlap with the active layer of the TFT in the light transmission direction, or overlapping portions of the first conductive layer with the active layer of the TFT in the light transmission direction have a pattern width less than other portions. Specifically, the first bridge located in the first conductive layer does not overlap with the active layer in the light transmission direction; or overlapping portions of the first bridge with the active layer of the TFT in the light transmission direction have a pattern width less than other portions; or a first touch-control electrode or a second touch-control electrode located in the first conductive layer does not overlap with the active layer in the light transmission direction; or overlapping portions of the first or second touch-control electrode with the active layer of the TFT in the light transmission direction have a pattern width less than that of other portions.

Furthermore, in order to completely prevent the light from being reflected from the first conductive layer to the active layer, the first conductive layer is partially provided in the first non-reflective region or the second non-reflective region. Specifically, the first non-reflective region overlaps with a part of the active layer in the light transmission direction, and a distance from the edge of the first non-reflective region to the edge of the active layer in the light transmission direction is greater than or equal to the vertical distance from the active layer to the first conductive layer. The second non-reflective region does not overlap with the active layer in the light transmission direction, and a distance from the edge of the second non-reflective region to the edge of the active layer in the light transmission direction is greater than or equal to the vertical distance from the active layer to the first conductive layer. The vertical distance from the active layer to the first conductive layer may be approximately equal to the sum of the thicknesses of membranous layers, such as the liquid crystal layer, the flat layer and the color filter layer, between the active layer and the first conductive layer.

Fourth Embodiment

Figure 11:
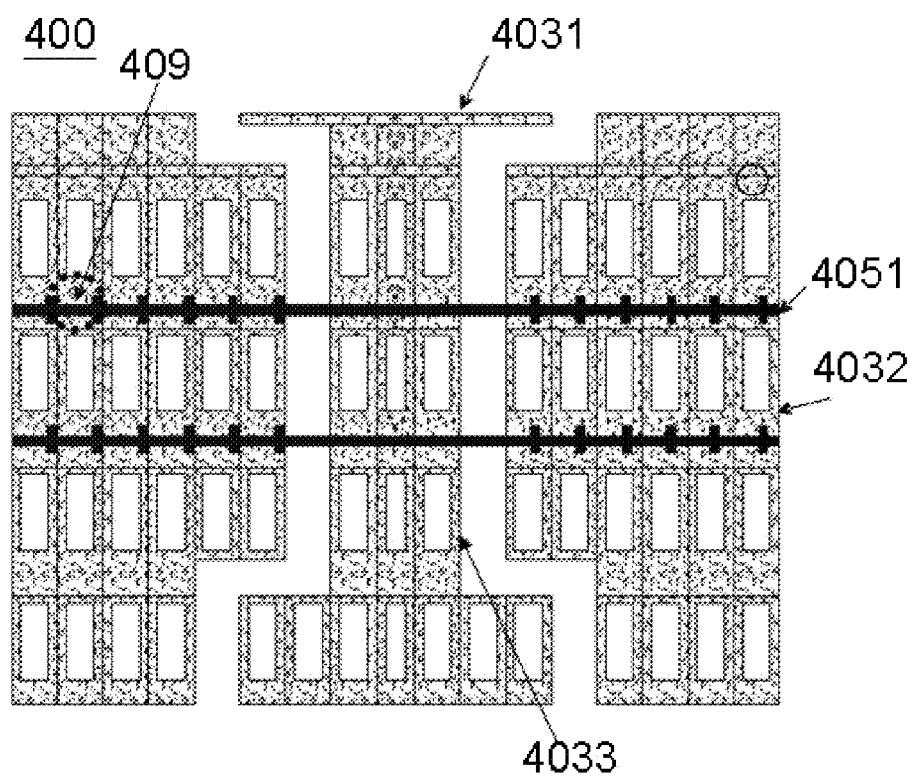
FIG. 11 is an enlarged diagram of a region C in FIG. 5.
Figure 12:
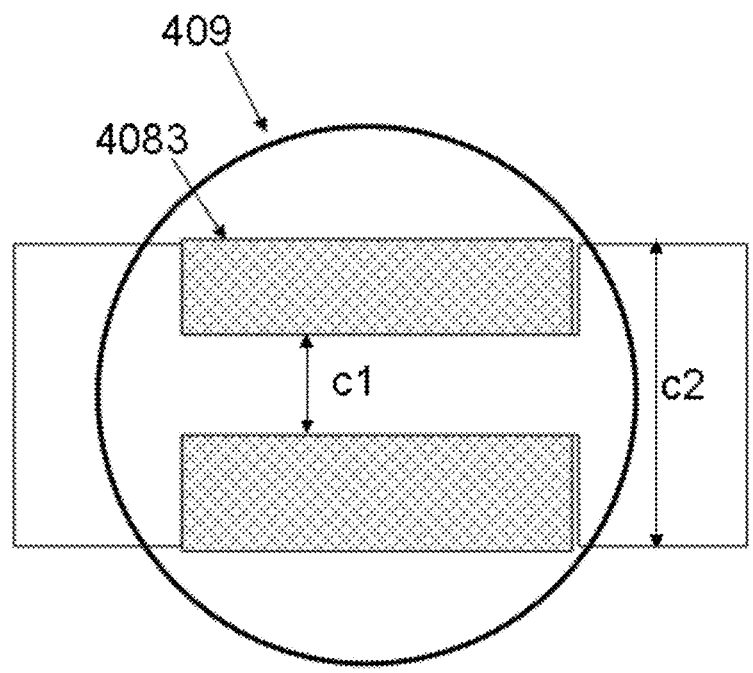
FIG. 12 is a schematic enlarged diagram of an implementation of a via hole according to a fourth embodiment.

A liquid crystal display device 400 with a built-in touch-control structure according to a fourth embodiment has a structure including the same portions as those of the second embodiment and the third embodiment, which will not be described in detail here. Reference may be made to FIG. 11 and FIG. 12, and the difference between the fourth embodiment and the second and third embodiments may be shown. FIG. 11 is a schematic enlarged diagram showing a second bridge located in a second conductive layer. FIG. 12 is a schematic enlarged diagram of a via hole.

In the fourth embodiment, a first conductive layer and a second conductive layer of a liquid crystal display device 400 are both metal layer. The first conductive layer includes multiple first electrodes 4031; multiple second electrodes 4032; and multiple first bridges 4033, by which two adjacent first electrodes 4031 are connected to form a driving line. The first electrode 4031 and the second electrode 4032 are both metal hollow electrode. A hollow portion overlaps with a color resist of a color filter layer. A non-hollow portion overlaps with a black matrix.

The first conductive layer is covered by the color filter layer located below the first conductive layer. Multiple via holes 409 are provided in the color filter layer. A part of the second electrode 4032 is deposited in the via hole 409. The second conductive layer includes multiple second bridges 4051. The second conductive layer is also partially deposited in the via hole 409. Two adjacent second electrodes 4032 are connected by the second bridge 4051 through the via hole provided in the color filter layer to form a sensing line.

In the via hole 409, a pattern width c1 of overlapping portions of the second conductive layer with the active layer 4083 is less than a pattern width c2 of other portions.

As a preferred implementation, in this embodiment, a pattern width c1 of a portion of the first conductive layer opposed to the active layer 4083 in the via hole 409 is less than a pattern width c2 of other portions. In addition, in the via hole 409, the first conductive layer overlaps with the second conductive layer in the light transmission direction, so that the reflected light from the first conductive layer and the second conductive layer can be reduced as much as possible.

It should be noted that in other implementations, the first conductive layer may be a transparent conductive layer, such as indium tin oxide. In this case, the pattern of the first conductive layer in the via hole may not be provided as above, because the transparent conductive layer has a weak light reflection effect.

Preferably, in order to ensure the conductive effect of the via hole, multiple via holes may be provided in each second bridge 4051 to electrically connect adjacent second electrodes 4032. Thus, even if some of the via holes fail to work, the normal work of the second bridge 4051 can still be ensured.

Preferably, the via holes 409 are provided at the same color resist. In this embodiment, the via holes 409 are all provided at the red color resist. Generally, the color filter layer includes a red color resist, a green color resist and a blue color resist. The via holes 409 are provided at the same color resist, thereby the transmittance of a pixel unit of the same color resistor is consistent, and the display homogeneity will be improved.

In other implementations, according to the design of the pixel, if in the via hole 409, the first conductive layer and the second conductive layer do not overlap with the active layer 4083 in the light transmission direction, the light reflection effect can also be reduced.

Figure 13:
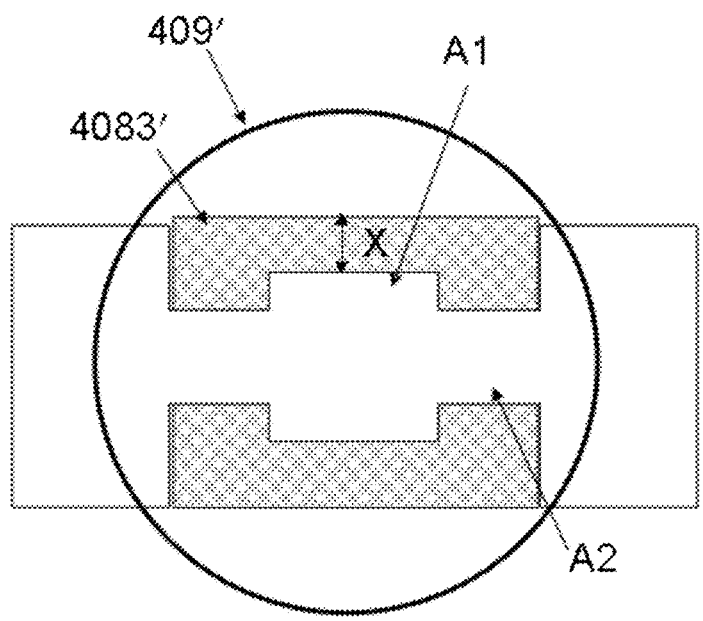
FIG. 13 shows another implementation of the via hole according to the fourth embodiment.

Preferably, in order to further reduce the reflected light from the metal layer in the via hole, reference may be made to FIG. 13, which shows another implementation according to this embodiment. In the via hole 409', the second conductive layer opposed to an active layer 4083' includes two portions. A first portion A1 is at least partially provided in the first non-reflective region. The first non-reflective region overlaps with a part of the active layer 4083' in the light transmission direction. A distance from the edge of the first non-reflective region to an edge of the active layer 4083' in the light transmission direction is X. The distance X is greater than or equal to a distance from the active layer 4083' to the second conductive layer. Preferably, the first portion A1 overlaps with the first non-reflective region as much as possible. Because no light will be reflected from the second conductive layer in this region to the active layer 4083', the area of first portion A1 may be set to be as large as possible, so as to reduce the resistance of the whole second conductive layer and the power consumption of the touch-control layer. In the via hole 409', the first conductive layer overlaps with the second conductive layer in the light transmission direction, which can reduce the light reflective rates of the first conductive layer and the second conductive layer.

Fifth Embodiment

A liquid crystal display device with a built-in touch-control structure according to a fifth embodiment has a structure including: a color filter substrate and a TFT array substrate provided oppositely, and a liquid crystal layer provided between the color filter substrate and the TFT array substrate. The color filter substrate includes a first substrate, a black matrix located below the first substrate, a first conductive layer, a color filter layer, a second conductive layer and a flat layer in this order. The TFT array substrate includes a second substrate, a TFT array located above the second substrate, and the like in this order. Specifically, the first conductive layer, the color filter layer and the second conductive layer constitute a touch-control layer structure, and the second conductive layer is provided on a side of the touch-control structure closer to the TFT array substrate.

Figure 14:
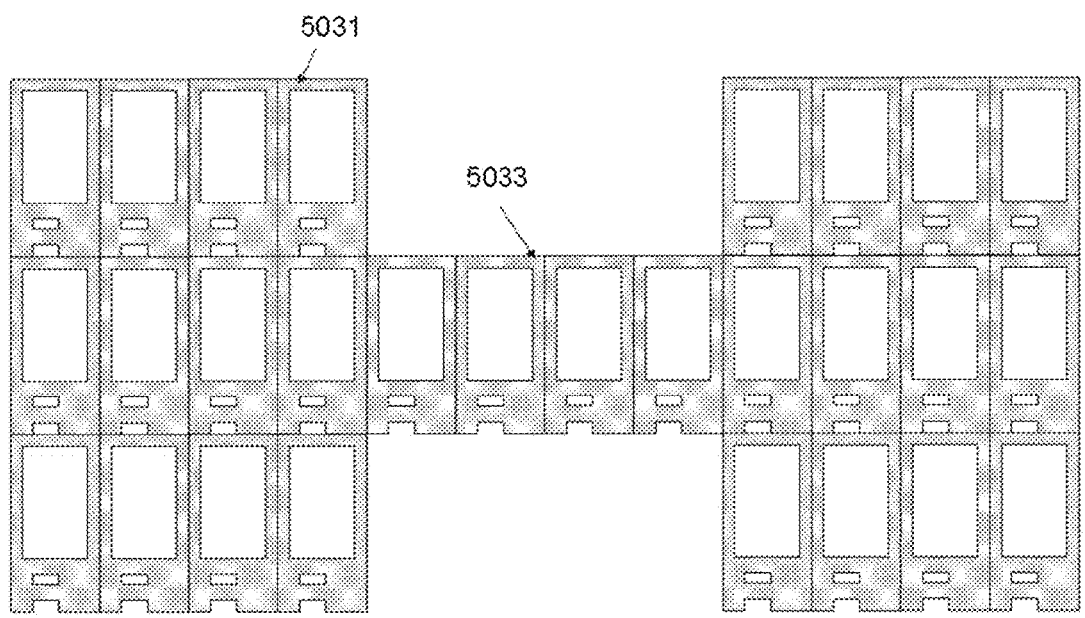
FIG. 14 shows a structure of a first conductive layer according to a fifth embodiment.
Figure 15:
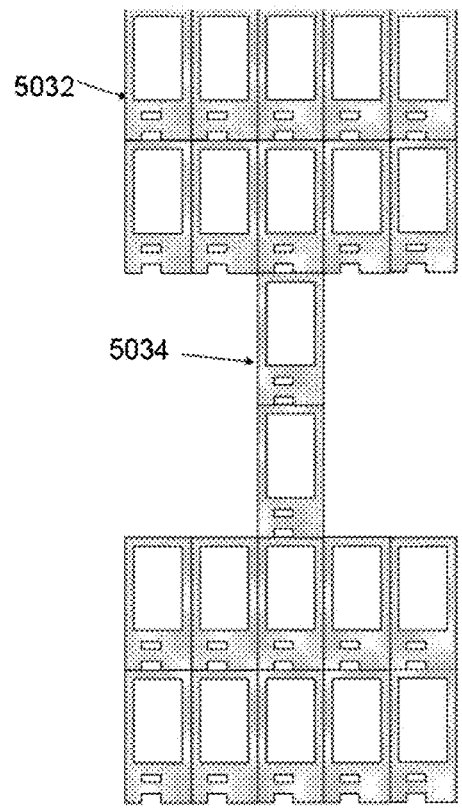
FIG. 15 shows a structure of a second conductive layer according to the fifth embodiment.
Figure 16:
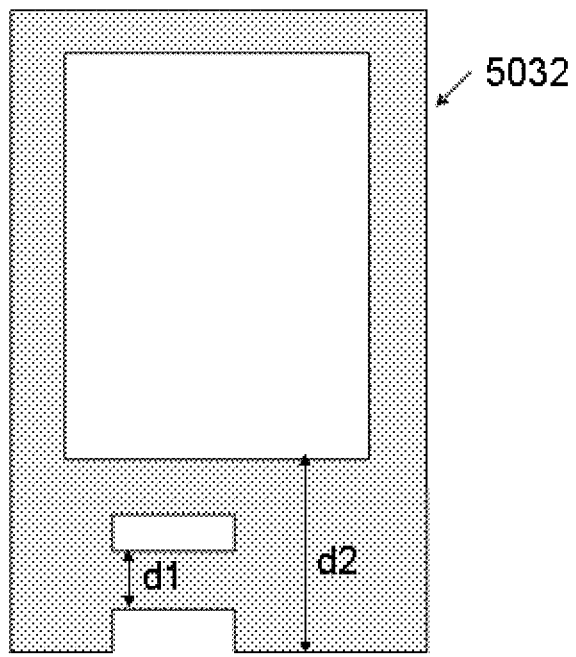
FIG. 16 is a schematic enlarged diagram of a region D in FIG. 15.

The same portion of the fifth embodiment as that of the second embodiment to the fourth embodiment will not be described in detail. Reference may be made to FIG. 14, FIG. 15 and FIG. 16. FIG. 14 shows a structure of a first conductive layer, FIG. 15 shows a structure of a second conductive layer, and FIG. 16 is a schematic enlarged diagram showing a region D in FIG. 15. The difference between this embodiment and the first embodiment to the fourth embodiment is as follows.

The first conductive layer includes multiple first touch-control electrodes 5031 and multiple first bridges 5033. The first conductive layer is a metal layer. The first touch-control electrode 5031 is a metal hollow electrode. The first bridge 5033 is a metal hollow bridge. The hollow portions of the first touch-control electrode 5031 and the first bridge 5033 are opposed to the color resist of the color filter layer, and the non-hollow portions thereof are opposed to the black matrix. Two adjacent first touch-control electrodes 5031 are connected by the first bridge 5033 to form a driving line. The first conductive layer is covered by the color filter layer located below the first conductive layer.

The second conductive layer includes multiple second touch-control electrodes 5032; and multiple second bridges 5034, by which two adjacent second touch-control electrodes 5032 are connected to form a sensing line. The second touch-control electrode 5032 is a metal hollow electrode. The second bridge 5034 is a metal hollow bridge. The hollow portions of the second electrode 503 and the second bridge 504 are opposed to the color resist of the color filter layer, and the non-hollow portions thereof are opposed to the black matrix. In other implementations, in order to reduce a difficulty of an alignment for different layers, the second bridge 5034 may also be implemented as a metal wiring. If the second conductive layer is a metal hollow bridge, the non-hollow portion needs to be aligned to the black matrix, the first conductive layer and the like, so that no extra opening ratio will be occupied. However, the difficulty of the alignment is great, due to the color filter layer between the first conductive layer and the second conductive layer. If a thinner metal wiring is used as the second bridge, the difficulty of the alignment will be reduced.

A pattern width d1 of the overlapping portions of the second touch-control electrode 5032 with an active layer in the light transmission direction is less than the pattern width d2 of other portions. In the liquid crystal display device with a built-in touch-control layer, the touch-control electrode is a metal layer with the largest area. Particularly, the second touch-control electrode 5032 is provided on a side of the second conductive layer closer to the TFT array substrate, and therefore the light reflected from the second touch-control electrode 5032 to an active layer is the most. In the fourth embodiment, a pattern width d1 of the overlapping portions of the second touch-control electrode 5032 with the active layer in the light transmission direction is less than the pattern width d2 of other portions, thus a photo leakage current caused by the reflected light from the second touch-control electrode 5032 to an active layer may be reduced significantly, and the display homogeneity of the liquid crystal display device with a built-in touch-control layer will be improved.

Figure 17:
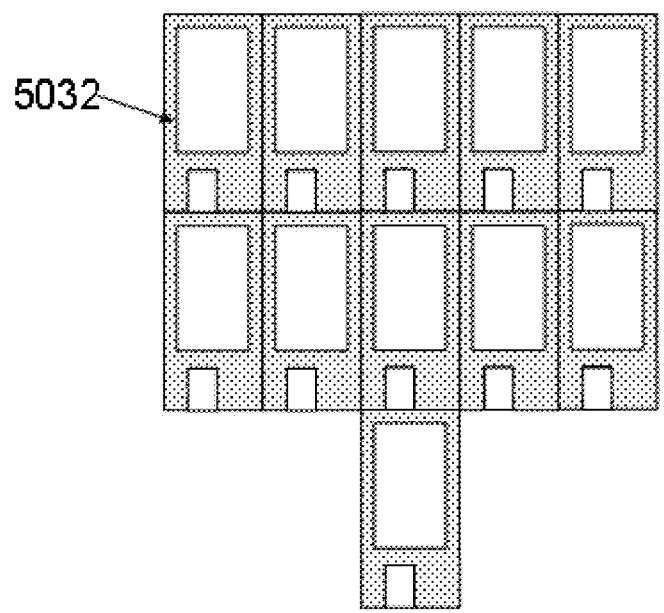
FIG. 17 is a schematic diagram of another implementation according to the fifth embodiment.

Optionally, referring to FIG. 17, in other implementations, the second touch-control electrode 5032 does not overlap with the active layer in the light transmission direction. It should be understood that in a second touch-control electrode 5032, the non-hollow portions are connected, therefore the fact that the second touch-control electrode 5032 does not overlap with the active layer in the light transmission direction will have no influence on the electrical connectivity of the whole electrode.

Optionally, the second touch-control electrode 5032 is at least partially provided in the second non-reflective region. The second non-reflective region does not overlap with the active layer in the light transmission direction, and a distance from the edge of the second non-reflective region to the edge of the active layer in the light transmission direction is greater than or equal to a vertical distance from the active layer to the second touch-control electrode 5032.

Figure 18:
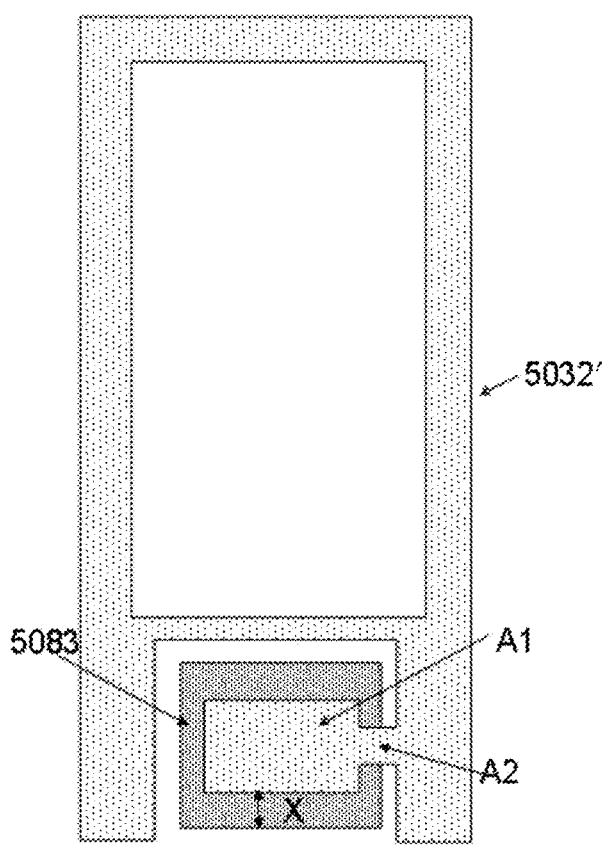
FIG. 18 is a schematic diagram of yet another implementation according to the fifth embodiment.

Optionally, referring to FIG. 18, in another implementation, a first portion A1 of the second electrode 5032' is located in the first non-reflective region. The first non-reflective region overlaps with a part of the active layer 5083 in the light transmission direction, and a distance X from the edge of the first non-reflective region to the edge of the active layer 5083 in the light transmission direction is greater than or equal to a vertical distance from the active layer 5083 to the second touch-control electrode 5032'. The first portion A1 of the second electrode 5032' is connected to the other portions of the second electrode 5032' via a second portion A2 thereof.

In this embodiment, the first conductive layer is also a metal layer. The first conductive layer does not overlap with the active layer of the TFT in the light transmission direction, or overlapping portions of the first conductive layer with the active layer of the TFT in the light transmission direction have a pattern width less than that of other portions. The overlapping portions of the first conductive layer with the active layer in the light transmission direction have a pattern width of 5 µm or less.

Preferably, the first conductive layer is at least partially located in the first non-reflective region. The first non-reflective region overlaps with a part of the active layer in the light transmission direction. A distance from the edge of the first non-reflective region to the edge of the active layer in the light transmission direction is greater than or equal to the vertical distance from the active layer to the first conductive layer.

Preferably, the first conductive layer is at least partially located in a second non-reflective region. The second non-reflective region does not overlap with the active layer in the light transmission direction. A distance from the edge of the second non-reflective region to the edge of the active layer in the light transmission direction is greater than or equal to a vertical distance from the active layer to the first conductive layer.

Optionally, the first conductive layer is located in the first non-reflective region or the second non-reflective region, which may be located at the touch-control electrode or the bridge.

In the technical solution provided in the present disclosure, no metal layer is provided in the position corresponding to the active layer of the TFTs on the TFT array substrate, thus a photo leakage current caused by the reflected light from the metal layer can be reduced. Because the metal layer is further provided in a region which is not influenced by the reflected light, a photo leakage current caused by the reflected backlight can be avoided. With the technical solution provided in the present disclosure, the reflection effect of multiple metal layers located on a side of the upper substrate facing to the lower substrate will be reduced, thereby reducing the photo leakage current further.

Obviously, various modifications and variations can be made to the invention by those skilled in the art without departing from the spirit and scope of the invention. Thus, if these modifications and variations made to the invention fall within the scope defined by the claims of the invention and equivalents thereof, the invention is also intended to include these modifications and variations.

What is claimed is:

1. A Thin Film Transistor-driven display device, comprising: an upper substrate; a lower substrate; a plurality of Thin Film Transistors (TFTs) disposed on a side of the lower substrate facing to the upper substrate, each having a width; and a plurality of metal wires disposed on a side of the upper substrate facing the lower substrate, wherein each of the metal wires is associated with and partially overlaps with a different one of active layers of the plurality of TFTs in a light transmission direction; wherein the overlapping part of each metal wire is at least partially located in a first non-reflective region of each of the metal wires, blocked from a backlight incident on the metal wires by the active layer of the TFT in the light transmission direction, and wherein a shortest distance from an edge of a projection of the first non-reflective region onto the active layer to an edge of the active layer is greater than or equal to a vertical distance from the active layer to the metal wires.

2. The TFT-driven display device according to claim 1, wherein the overlapping part of each metal wire with the active layer of the TFTs in the light transmission direction has a line width of 5 µm or less.

3. The TFT-driven display device according to claim 1, wherein the non-overlapping part of each metal wire is located in a second non-reflective region non-overlapping with the active layer in the light transmission direction, and a shortest distance from an edge of the second non-reflective region to an edge of a projection of the active layer onto the metal wires is greater than or equal to a vertical distance from the active layer to the metal wires.

4. The TFT-driven display device according to claim 1, wherein the metal wires are arranged in a touch-control structure provided on the side of the upper substrate facing the lower substrate.

5. The TFT-driven display device according to claim 4, wherein the touch-control structure comprises a first conductive layer and a second conductive layer, an insulating layer disposed between the first conductive layer and the second conductive layer, and the second conductive layer is provided on a side of the touch-control structure closer to the active layer.

6. The TFT-driven display device according to claim 5, wherein the second conductive layer comprises the metal wires.

7. The TFT-driven display device according to claim 6, wherein the second conductive layer comprises bridges, and overlapping portions of the second conductive layer located at the bridges with the active layer of the TFTs in the light transmission direction have a pattern width less than a pattern width of other portions of the second conductive layer.

8. The TFT-driven display device according to claim 7, wherein the second conductive layer located at the bridges is at least partially located in the first non-reflective region, or the second conductive layer located at the bridges is at least partially located in the second non-reflective region.

9. The TFT-driven display device according to claim 6, wherein the second conductive layer comprises touch-control electrodes, and overlapping portions of the second conductive layer located at the touch-control electrodes with the active layer of the TFTs in the light transmission direction have a pattern width less than a pattern width of other portions of the second conductive layer.

10. The TFT-driven display device according to claim 9, wherein the second conductive layer located at the touch-control electrodes is at least partially located in the first non-reflective region, or the second conductive layer located at the touch-control electrodes is at least partially located in the second non-reflective regions.

11. The TFT-driven display device according to claim 5, wherein the first conductive layer comprises the metal wires.

12. The TFT-driven display device according to claim 11, wherein the first conductive layer comprises bridges, and overlapping portions of the first conductive layer located at the bridges with the active layer of the TFTs in the light transmission direction have a pattern width less than that of other portions of the first conductive layer.

13. The TFT-driven display device according to claim 12, wherein the bridges are at least partially located in the first non-reflective region, or the bridges are at least partially located in the second non-reflective regions.

14. The TFT-driven display device according to claim 11, wherein the first conductive layer comprises touch-control electrodes, and overlapping portions of the first conductive layer located at the touch-control electrodes with the active layer of the TFTs in the light transmission direction have a pattern width less than that of other portions of the first conductive layer.

15. The TFT-driven display device according to claim 14, wherein the touch-control electrodes are at least partially located in the first non-reflective region, or the touch-control electrodes are at least partially located in the second non reflective region.

\* \* \* \* \*